United States Patent
Kliemann et al.

(10) Patent No.: US 9,556,508 B2
(45) Date of Patent: Jan. 31, 2017

(54) METHOD FOR THE PHOTOCATALYTICALLY ACTIVE COATING OF SURFACES

(71) Applicant: LINDE AKTIENGESELLSCHAFT, Munich (DE)

(72) Inventors: Jan-Oliver Kliemann, Hamburg (DE); Henning Gutzmann, Hamburg (DE); Thomas Klassen, Wentorf (DE); Frank Gaertner, Hamburg (DE)

(73) Assignee: LINDE AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 14/345,992

(22) PCT Filed: Sep. 18, 2012

(86) PCT No.: PCT/EP2012/068296
§ 371 (c)(1),
(2) Date: Mar. 20, 2014

(87) PCT Pub. No.: WO2013/041506
PCT Pub. Date: Mar. 28, 2013

(65) Prior Publication Data
US 2014/0242417 A1   Aug. 28, 2014

(30) Foreign Application Priority Data
Sep. 20, 2011   (DE) .................. 10 2011 083 054

(51) Int. Cl.
*C23C 14/02* (2006.01)
*B01J 37/02* (2006.01)
(Continued)

(52) U.S. Cl.
CPC ............ *C23C 14/025* (2013.01); *B01J 21/063* (2013.01); *B01J 35/004* (2013.01); *B01J 35/023* (2013.01);
(Continued)

(58) Field of Classification Search
None
See application file for complete search history.

(56) References Cited

U.S. PATENT DOCUMENTS

2007/0110919 A1   5/2007   Ballhorn et al.
2008/0262607 A1*  10/2008  Fricke .................. A61L 31/088
                                                     623/1.46
(Continued)

FOREIGN PATENT DOCUMENTS

DE   102004038795 A1    3/2006
DE   EP 1652963 A1 *    5/2006   ............ C23C 14/02
(Continued)

OTHER PUBLICATIONS

Machine Translation of JP 2000-131513; May 2000.*
(Continued)

*Primary Examiner* — Michael P Rodriguez
(74) *Attorney, Agent, or Firm* — Millen White Zelano and Branigan, PC; John Sopp; Anthony Zelano

(57) ABSTRACT

A method for the photocatalytically active coating of surfaces is presented and described, as well as an article (1) photocatalytically actively coated according to this method. The object of providing a method for the photocatalytically active coating of, in particular, metallic surfaces, whereby a permanently stable coating is produced without negatively affecting the photocatalytic activity of the layer, is achieved by a method, in which a substrate article is prepared which has a surface, a metallic adhesion-promoting layer is applied to the surface of the substrate article, a photocatalytically (Continued)

active layer consisting of one or more metal oxides is applied to the adhesion-promoting layer, wherein the metallic adhesion-promoting layer and the surface of the substrate article consist of a different material and the adhesion-promoting layer is selected such that it is not oxidized or reduced by the photocatalytically active layer.

12 Claims, 1 Drawing Sheet

(51) Int. Cl.
      *B01J 21/06* (2006.01)
      *B01J 35/00* (2006.01)
      *C23C 4/02* (2006.01)
      *C23C 4/04* (2006.01)
      *C23C 4/18* (2006.01)
      *C23C 16/02* (2006.01)
      *C23C 24/04* (2006.01)
      *C23C 28/00* (2006.01)
      *B01J 37/34* (2006.01)
      *B01J 35/02* (2006.01)

(52) U.S. Cl.
      CPC ......... *B01J 37/0217* (2013.01); *B01J 37/0225* (2013.01); *B01J 37/0238* (2013.01); *B01J 37/348* (2013.01); *B01J 37/349* (2013.01); *C23C 4/02* (2013.01); *C23C 4/04* (2013.01); *C23C 4/11* (2016.01); *C23C 4/18* (2013.01); *C23C 16/0281* (2013.01); *C23C 24/04* (2013.01); *C23C 28/322* (2013.01)

(56) References Cited

U.S. PATENT DOCUMENTS

2010/0015467 A1\* 1/2010 Zimmermann ........... B22F 7/08
                                                                                           428/615
2012/0073640 A1\* 3/2012 Daniel ............ H01L 31/022466
                                                                                           136/256

FOREIGN PATENT DOCUMENTS

| DE | 102005053247 A1 | | 5/2007 | |
| --- | --- | --- | --- | --- |
| DE | EP 2302099 A1 | \* | 3/2011 | ............ C23C 24/04 |
| DE | 102009043319 A1 | | 7/2011 | |
| EP | 1652963 A1 | | 5/2006 | |
| JP | 2000131513 A | \* | 5/2000 | |
| KR | 20050109003 A | \* | 11/2005 | |
| WO | 2012136127 A1 | | 10/2012 | |

OTHER PUBLICATIONS

Machine Translation of KR 2005-0109003 Nov. 2005.\*
Machine Translation of EP 1652963; May 2006.\*
Machine Translation of EP 2302099; Mar. 2011.\*
International Search Report from PCT/EP2012/068296 dated Dec. 10, 2012.

\* cited by examiner

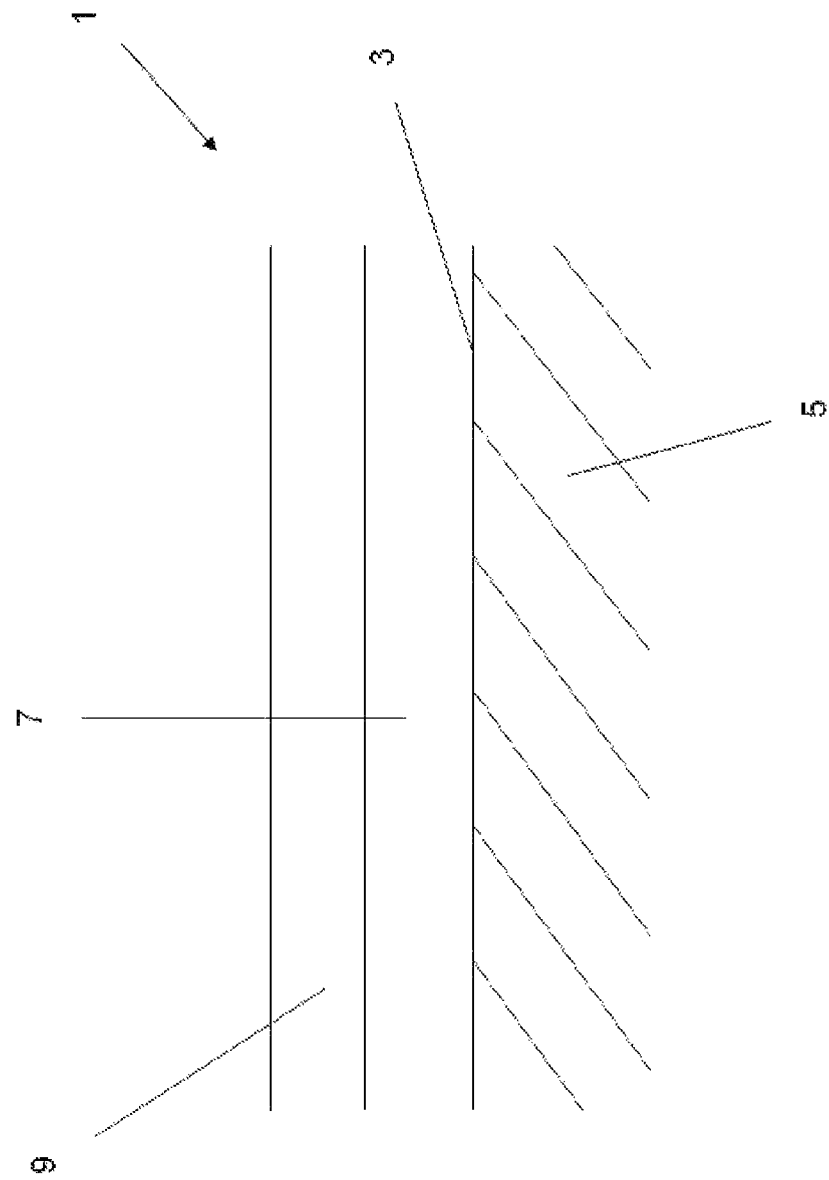

METHOD FOR THE PHOTOCATALYTICALLY ACTIVE COATING OF SURFACES

The present invention relates to a method for the photocatalytically active coating of surfaces, in particular metal surfaces as of sanitary and kitchen articles, medical devices that consist of metal or have metallic surfaces as well as the articles that can be produced with this method.

STATE OF THE ART

Photocatalytic coatings can be used for water purification, air purification and hydrogen production as well as self-cleaning and self-disinfecting surfaces. In water purification in particular highly soluble organic waste products which can otherwise be removed only with difficulty, can be oxidized or reduced by means of photocatalysis. In the case of air purification car exhaust gases such as e.g. nitrogen monoxide can be oxidized to nitrates, aldehydes and ketones are in each case oxidized to $CO_2$ and thus rendered harmless.

Surface disinfection is of particular interest and relevance in hospitals, sanitary facilities and canteen kitchens.

Bacterial contamination and unpleasant odours in public toilets and washbasins still remain a problem. Tests carried out by the motoring associations repeatedly confirm that most of the public toilets in motorway service areas have germs and bacteria that can have a detrimental effect on human health. Various microorganisms have been found, in particular on door handles, toilet seats and washbasins.

The list of germs found is regularly long and worrying. Those that reappear annually in the testers' league tables include faecal germs which can appear due to inadequate cleaning. In addition, pathogens causing various intestinal and worm diseases but also fungi are repeatedly discovered. In very rare cases infection with hepatitis A, chlamydia or sexually transmitted diseases may occur.

Existing disinfection methods can only be carried out at great expense in terms of personnel and time, and are nevertheless inadequate. Cleaning protocols on the walls of public conveniences are meant to provide a sense of safety, which often cannot however obscure the actual degree of cleanliness. This is because in many cases there is great uncertainty among the responsible cleaning staff. If for example different surfaces are cleaned with a cloth, the germs are only carried further, rather than removed. In the sanitary facilities of swimming pools, fitness studios or saunas bacteria of all kinds are also found to have just multiplied, as the damp environment here helps them to spread.

In addition, on grounds of cost, public sanitary facilities often have metal surfaces which are particularly difficult to clean. Lime scale deposits, at the interfaces of which colonies of bacteria can grow, are more difficult to remove than from ceramic surfaces. Until now uncoated metal surfaces have been used, as conventional sol-gel coatings are not abrasion-resistant and degrade the organic binder over a longer period.

Kitchen articles such as worktops, shelves or extractor hoods in industrial kitchens, in particular canteen kitchens, as well as medical articles such as operating tables or hospital beds have metal surfaces because they can be better disinfected against bacterial infestation. Correspondingly, regular cleaning and hygiene measures are usually prescribed for these kitchen articles and medical equipment. The aim of the prescribed disinfection procedures is to reduce the germs e.g. by a specific factor of the living microorganisms. However, experience has shown that cleaning and hygiene measures are not always reliably implemented. Failure to carry out disinfection correctly therefore results in contamination, wherein bacteria, fungi and viruses can spread rapidly under the conditions prevailing there. A gap in sterility also occurs between disinfection cycles, as chemical disinfection is effective only for a short time.

Nosocomial infections are also a problem in hospitals. Above all, infections with multi-resistant pathogens against which most antibiotics are no longer effective represent a new challenge to hospitals.

DE 10 2004 038 795 describes the production of photocatalytically active surfaces on plastics by cold gas spraying. Particles of the photocatalytically active oxide material are accelerated by a carrier gas, penetrate the polymer surface completely or partially on impact and, due to their high kinetic energy form a mechanically firmly adhering polymer/oxide bond. This application relates only to polymer layers. It must be borne in mind that the catalytic effect of the titanium dioxide can also lead to the degradation of the plastic.

DE 10 2005 053 263 describes the production of photocatalytically active surfaces on metals by cold gas spraying. A mixture of titanium dioxide ceramics and metallic powder is sprayed onto the metallic surface. Spraying hard ceramics with a metal mixture has the advantage that here components that can be deformed on impact are always available. The metal parts are deformed on impact and thus allow the construction of thicker layers. However, this published document describes only the degradation of organic substances by photocatalytically active titanium dioxide, not the killing of bacteria or viruses.

DE 10 2009 043 319 A1 describes a method for the photocatalytically active coating of metallic surfaces of, in particular, sanitary articles, kitchen articles and medical equipment by means of the cold gas spraying technique as well as articles that can be produced with this method. According to this method, as also according to the other methods known from the state of the art, the photocatalytically active layer is applied directly onto the metallic surface, whereby the two substances come into direct contact with each other.

The photocatalytically active coatings described ensure degradation of the germs on the coated surfaces. In photocatalysis, light produces electron-hole pairs in the photocatalytically active layer if the energy of the photons is greater than the bandgap of the layer. Then, on the surface of the photocatalytically active layer, the electrons or holes form radicals which lead to the degradation of organic substances, i.e. to the degradation of the germs.

In the case of the coatings according to the state of the art it has however been observed that in long-term use their photocatalytic activity also gives rise to decomposition phenomena in the case of substrate materials such as high-grade steel, copper or aluminium which are normally resistant to weathering and chemicals. For example it has been found that titanium dioxide is able to reduce $Fe^{3+}$ ions present in steel to water-soluble $Fe^{2+}$ ions. The bonding zone between substrate material and coating can thereby be eroded, whereby the coating becomes unstable and falls off. A similar observation has been made in the case of the substrate materials copper (a noble metal) and aluminium. This is surprising in particular because these materials form relatively stable oxides on their surface and are therefore difficult to oxidize. Nevertheless, the photocatalytically active material is clearly able to attack the aluminium oxides and copper oxides as well as high-grade steel coatings made of nickel oxide and/or copper oxide.

Starting from the state of the art the object of the present invention is therefore to provide a method for the photocatalytically active coating of metallic surfaces, with which a permanently stable coating can be produced, without negatively affecting the photocatalytic activity of the layer.

DESCRIPTION OF THE INVENTION

This object is achieved by a method for the photocatalytically active coating of surfaces, in which:
 i) a substrate article which has a surface is prepared,
 ii) a metallic adhesion-promoting layer is applied to the surface of the substrate article,
 iii) a photocatalytically active layer consisting of one or more metal oxides is applied to the adhesion-promoting layer,
wherein the metallic adhesion-promoting layer and the surface of the substrate article consist of different material and the adhesion-promoting layer is selected such that it is not oxidized or reduced by the photocatalytically active layer.

The surface of the substrate article is preferably a metal surface, wherein the substrate article, apart from the surface to be coated, can also comprise other materials, such as e.g. plastics or ceramics. According to the invention it is therefore conceivable for example, that the substrate article is substantially formed from plastic but has a metallic coating on its surface. Any surface can be coated. However metallic surfaces are preferably coated. The metallic surface preferably consists of aluminium, copper, steel, preferably high-grade steel, or alloys of these materials. In a further preferred embodiment the metallic surface of the substrate article is formed from high-grade steel, aluminium or copper. High-grade steel, aluminium and copper are the most common metallic materials for articles susceptible to germs. However other metals are also conceivable as surface material.

Photocatalytically active materials are known to a person skilled in the art. These are generally photo-semiconductors, which produce electron-hole pairs when exposed to light, if the energy of the photons is greater than the bandgap between valence and conduction band (photo-electric effect). The electrons or holes diffuse on the surface of the photocatalytic material and there produce radicals which lead to the degradation of organic substances. The photocatalytically active material is preferably selected from the group consisting of $TiO_2$, $WO_3$, $SrTiO_3$, $SnO_2$, SiC, $NaTaO$, ZnO, $\alpha$-$Fe_2O_3$, $BiVO_4$, TaON, $Ta_3N_5$, $InTaO_4$ and $InNbO_4$. Particularly preferably the photocatalytic material is titanium dioxide, in particular anatase.

The adhesion-promoting layer is selected such that it is not reduced or oxidized by the photocatalytically active material. The material of the adhesion-promoting layer is preferably selected from the group consisting of titanium, zinc, tin, nickel and/or chromium. Titanium is particularly preferred as material of the adhesion-promoting layer. However, if the photocatalytically active Material is not titanium dioxide, further materials are taken into consideration as adhesion-promoting layer, in particular the metal which corresponds to the metallic component of the metal oxide from which the photocatalytically active layer is formed. In the case where $WO_3$ is used as photocatalytically active material, besides the above-named materials tungsten can therefore also be used as material of the adhesion-promoting layer; in the case where $BiVO_4$ is used as photocatalytically active material bismuth or vanadium can therefore also be used as material of the adhesion-promoting layer, besides the above-named materials.

According to a preferred embodiment the photocatalytically active layer is applied to the metallic surface by means of a thermal spraying process selected from the group consisting of cold gas spraying, HVOF spraying, plasma spraying, suspension spraying, or by means of a chemical or physical deposition process selected from the group consisting of sol-gel processes, CVD, PVD, sputtering. Cold gas spraying is particularly preferred here, wherein the spray material further preferably has a particle size with a cross-section of between 5 and 150 µm, the pressure at which spraying takes place is preferably 20 to 100 bar and the temperature of the gas during spraying is preferably 200 to 1200° C.

According to a further preferred embodiment the adhesion-promoting layer is applied to the metallic surface by means of a thermal spraying process selected from the group consisting of cold gas spraying, HVOF spraying, plasma spraying, suspension spraying or by means of a galvanic process. Cold gas spraying is also particularly preferred here, wherein the spray material further preferably has a particle size with a cross-section of between 5 and 150 µm, the pressure at which spraying takes place is preferably 20 to 100 bar and the temperature of the gas during spraying is preferably 200 to 1200° C. Furthermore, galvanic processes are also advantageous.

In a particularly preferred embodiment the substrate article is selected from the series of sanitary, kitchen or medical articles, handholds, light switches, door handles, food belts, beverage filling plants, control elements, keyboards, bedsteads or lamps. These are the worst articles to be affected by germs, as germs here can cause great harm—primarily to human health. However, they represent only a selection of all the possible substrate articles that can reasonably be used.

A further aspect of the present invention relates to a photocatalytically actively coated article which can be obtained by a process described above. The article comprises a substrate article with a metallic surface, which is preferably formed from high-grade steel, aluminium or copper. To this surface adheres an adhesion-promoting layer and to that a photocatalytically active layer, wherein the adhesion-promoting layer is selected such that it is not oxidized or reduced by the photocatalytically active layer. The adhesion-promoting layer is preferably formed from titanium. The photocatalytically active layer adhering to the adhesion-promoting layer preferably consists of titanium dioxide, particularly preferably in the form of anatase. Adhesion-promoting layer and photocatalytically active layer are preferably arranged on top of each other on the metallic surface such that the adhesion-promoting layer completely physically isolates the photocatalytically active layer from the metallic surface.

The present invention is explained below with reference to a drawing representing an embodiment example. The drawing shows in

BRIEF DESCRIPTION OF THE DRAWING

FIG. 1 a partial cross-section of the photocatalytically active coated metallic surface of an embodiment example of the article according to the invention.

In FIG. 1 an embodiment example of a photocatalytically actively coated article according to the invention is represented. The article 1 comprises a substrate article 5 which, in the present embodiment example, is formed from high-grade steel, but in principle can also be formed from copper, aluminium or other, including non-metallic, materials and has a metallic surface 3. In this embodiment example, the metallic surface 3 is provided also made of high-grade steel.

An adhesion-promoting layer 7 made of titanium, which has been applied by means of a thermal spraying process, in the present case using the cold gas spraying technique, adheres to the metallic surface 3. Finally, a photocatalytically active layer 9 made of titanium dioxide in the form of anatase, which is also applied by means of a thermal spraying process, in this case by means of the cold gas spraying technique, adheres to the adhesion-promoting layer 7.

The two layers 7, 9 are applied such that the adhesion-promoting layer 7 physically isolates the photocatalytically active layer 9 from the metallic surface 3, with the result that no chemical reactions can occur between the metallic surface of the substrate material 3 and the photocatalytically active layer 9.

Titanium is particularly well-suited as adhesion-promoting layer 7, as it forms a stable surface layer made of titanium dioxide which in turn is itself a very highly photocatalytically active substance and thus promotes the photocatalytic activity of the photocatalytically active layer 9.

EXAMPLES

The chemical stability of the coatings decisively depends on the substrate material. Both in field testing and also in the DCA reactor (an aqueous solution of dichloroacetic acid) significant differences manifest themselves between different substrate materials.

The $TiO_2$ layers on titanium substrate have the best resistance. In the case of the DCA decomposition above all the $TiO_2$ layers on copper substrate and in particular the layers on steel substrate exposed to the weather are strongly attacked and peeled off. In field testing the degradation phenomena occurred only in the case of the $TiO_2$-coated substrates made of aluminium, copper and high-grade steel, which indicates that a chemical interaction takes place between the photo-catalyst and the substrate materials.

Aluminium, as a non-noble metal (−1.66 V vs. NHE) is also permanently coated with an oxide layer made of $Al_2O_3$. However, following the weather influences, in some areas the cold-gas sprayed samples show corrosion cracks, which are not visible on the starting substrates even after 680 days of field testing.

Unlike aluminium and titanium, copper forms no corrosion-resistant oxide ceramic layer on the surface. Copper is corrosion-resistant because in the presence of water it forms a copper (I) oxide $Cu_2O$ layer (red) on the surface as an intermediate product. This layer must be penetrated by electrons and ions in order to allow further corrosion, resulting in extreme slowing down of the further progress of the corrosion as in the case of other passivation layers. Copper (II) oxide CuO is black. Initially, under the influence of $TiO_2$ both the black-reddish oxides (mixture) are formed and also a greenish covering which however soon disappears again and gives way to the black oxides, i.e. CuO. The peeling off of the $TiO_2$ coating in the DCA plant can be explained with reference to the DCA reaction: in the presence of oxygen dissolved in water, the $Cu_2O$ layer is no longer stable, but is oxidized to CuO. The high levels of activity of the $TiO_2$ layers on copper substrates in the DCA decomposition are possibly also favoured by this reaction as, in the DCA decomposition reaction equation, dissolved oxygen must be broken down for the oxidation just as for the copper oxidation.

The most interesting and at the same time most obscure behaviour is exhibited by $TiO_2$ layers on steel substrate. The 1.4301 steel used here is an austenitic steel (cubic face-centred) and has a composition of iron with <0.08% carbon, 18-20% chromium and 8-10.5% nickel. The corrosion resistance of stainless steels is generally based on a corrosion-resistant chromium oxide layer on the surface of the steel. With a standard electrode potential of $Cr^{3+}/Cr_2O_{2-7}$=+1.33 V vs. NHE, this chromium oxide layer is electrochemically very stable, and should therefore not contribute to the observed peeling off of $TiO_2$. Nickel, which determines the austenitic structure of the steel, can also not be (solely) responsible for the peeling off of the $TiO_2$ coating, because it is present dissolved in the iron matrix and a peeling off exclusively as a result of nickel oxidation would be unlikely. Presumably the iron matrix itself plays the decisive role in the delamination: when the steel substrate is coated by cold gas spraying the oxide layer on the surface is very probably broken, with the result that the embedded $TiO_2$ particles are in direct contact with iron. Iron also forms a passivation layer made of $Fe(OH)_3$ which, with a standard electrode potential of $Fe^{2+}/Fe^{3+}$=+0.77 is less noble than the chromium oxide layer, but nevertheless, due to its poor solubility in water forms a watertight passivation layer. $TiO_2$ is however able to reduce $Fe^{3+}$ to $Fe^{2+}$. The better solubility of $Fe(OH)_2$ could have led to a slow leaching of the metallic bond and thus to the observed peeling off of the $TiO_2$ particles.

The invention claimed is:

1. Method for the photocatalytically active coating of surfaces, in which:
   i) a substrate article (5) which has a surface (3) is prepared,
   ii) a titanium-containing metallic adhesion-promoting layer (7) is applied to the surface (3) of the substrate article (5),
   iii) a photocatalytically active layer (9) consisting of one or more titanium metal oxides is applied to the metallic adhesion-promoting layer (7) by cold gas spraying, wherein the metallic adhesion-promoting layer (7) and the surface (3) of the substrate article (5) consist of different material.

2. Method according to claim 1, wherein the photocatalytically active layer (9) is formed from a metal oxide selected from the group consisting of $TiO_2$ and $SrTiO_3$.

3. Method according to claim 2, wherein the photocatalytically active layer (9) is formed from titanium dioxide.

4. Method according to claim 3, wherein the photocatalytically active layer (9) is formed from anatase.

5. Method according to claim 1, wherein the substrate article (5) is selected from the series of sanitary, kitchen or medical articles, handholds, light switches, door handles, food belts, beverage filling plants, control elements, keyboards, and bedsteads.

6. Method according to claim 1, wherein the cold spraying is conducted with a spray material which has a particle size with a cross-section of between 5 and 150 μm.

7. Method according to claim 1, wherein the pressure for the cold spraying is 20 to 100 bar.

8. Method according to claim 1, wherein the temperature for the cold spraying is 200 to 1200° C.

9. Photocatalytically actively coated article (1), which is obtained by a method according to claim 1.

10. Method according to claim 1, wherein the surface (3) of the substrate article (5) is a metallic surface.

11. Method according to claim 10, wherein the adhesion-promoting layer (7) is applied to the surface (3) by means of a thermal spraying process selected from the series: cold gas spraying, HVOF spraying, plasma spraying, and suspension spraying; or by means of a galvanic process.

12. Method according to claim 10, wherein the surface (3) of the substrate article (5) is formed from high-grade steel, aluminum or copper.

* * * * *